United States Patent
Dent et al.

(10) Patent No.: US 7,570,123 B2
(45) Date of Patent: Aug. 4, 2009

(54) DIGITALLY CONTROLLED ANALOG FREQUENCY SYNTHESIZER

(75) Inventors: Paul Wilkinson Dent, Pittsboro, NC (US); Nikolaus Klemmer, Cary, NC (US)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 180 days.

(21) Appl. No.: 11/616,598

(22) Filed: Dec. 27, 2006

(65) Prior Publication Data
US 2008/0157881 A1 Jul. 3, 2008

(51) Int. Cl.
H03B 27/00 (2006.01)
(52) U.S. Cl. .............................. 331/45; 331/16; 331/17
(58) Field of Classification Search .................. 331/16, 331/17, 45
See application file for complete search history.

(56) References Cited

U.S. PATENT DOCUMENTS

| | | | | |
|---|---|---|---|---|
| 4,669,024 | A * | 5/1987 | Stacey | 361/85 |
| 5,198,779 | A | 3/1993 | Bruton | |
| 5,654,677 | A | 8/1997 | Dent | |
| 5,694,088 | A | 12/1997 | Dickson | |
| 5,774,799 | A | 6/1998 | Croft et al. | |
| 5,801,589 | A | 9/1998 | Tajima et al. | |
| 6,205,183 | B1 | 3/2001 | Dent | |
| 6,278,746 | B1 | 8/2001 | Velez et al. | |
| 6,278,867 | B1 | 8/2001 | Northcutt et al. | |
| 6,326,851 | B1 | 12/2001 | Staszewski et al. | |
| 6,483,388 | B2 | 11/2002 | Khan | |
| 6,522,176 | B1 | 2/2003 | Davis | |
| 6,603,362 | B2 | 8/2003 | Von Dolteren, Jr. | |
| 6,768,389 | B2 | 7/2004 | Dent et al. | |
| 6,867,625 | B1 | 3/2005 | Stoyanov | |
| 7,483,508 | B2 * | 1/2009 | Staszewski et al. | 375/376 |
| 2004/0075506 | A1 | 4/2004 | Welland et al. | |
| 2006/0167962 | A1 | 7/2006 | Torosyan | |
| 2007/0025490 | A1 * | 2/2007 | Azadet et al. | 375/376 |

OTHER PUBLICATIONS

Mak, P. et al. "A Novel IF Channel Selection Technique by Analog-Double Quadrature Sampling for Complex Low-IF Receivers." Proceedings of International Conference of Communication Technology, pp. 1238-1241, Beijing, China, Apr. 2003.

Mak, P. et al. "Frequency-Downconversion and Channel Selection Sample-and-Hold Circuit with A-DQS Technique for Complex Low-IF Wireless Receivers." Proceedings of IEEE International Conference of Electronics, Circuits and Systems (ICECS), pp. 479-482, Sharjah, United Arab Emirates, 2003.

Curticapean, F. et al. "Quadrature Direct Digital Frequency Synthesizer Using an Angle Rotation Algorithm." IEEE International Symposium on Circuits and Systems, Bangkok, Thailand, May 25-28, 2003, pp. 479-482.

* cited by examiner

*Primary Examiner*—Robert Pascal
*Assistant Examiner*—James E Goodley
(74) *Attorney, Agent, or Firm*—Coats & Bennett, P.L.L.C.

(57) ABSTRACT

A frequency synthesizer according to the present invention digitally controls an analog oscillator to generate an analog output signal at a desired frequency. A digitizing circuit converts a feedback signal derived from the oscillator output signal to a digitized multi-phase feedback signal. A comparator compares the digitized multi-phase feedback signal to a reference signal generated by the reference signal generator to generate an error signal indicative of the phase error in the output signal. A control circuit generates a control signal based on the error signal to control the frequency of the oscillator output signal.

44 Claims, 3 Drawing Sheets

DIGITALLY CONTROLLED ANALOG FREQUENCY SYNTHESIZER

BACKGROUND

The present invention relates generally to frequency synthesizers, and more particularly to digitally controlled frequency synthesizers.

Most electronic communications devices include a frequency synthesizer. Conventional frequency synthesizers typically use an accurate reference oscillator, such as a crystal or surface acoustic wave (SAW) resonator, to control a controllable oscillator to generate one or more output signals at a desired frequency. The electronic device uses the output signal(s) to control timing and/or communication operations.

Direct digital synthesizers represent one type of frequency synthesizer. A direct digital synthesizer computes a digital sequence to address a table of values to produce samples of a waveform at a desired output frequency. The synthesizer produces an analog output signal at the desired frequency by performing a digital to analog conversion on the computed output sequence. While direct digital synthesizers may be manufactured on relatively small circuits, they often consume undesirably large amounts of power, especially when generating output signals at cellular communication frequencies.

A phase-locked loop (PLL) synthesizer represents another type of frequency synthesizer. PLL synthesizers use a frequency-controllable oscillator running at a frequency in the approximate desired frequency range to generate the output signal. To control the oscillator, the PLL divides the oscillator output signal in frequency by a predetermined factor n. The divided output is compared to a reference frequency using an analog phase detector to obtain a phase error signal indicative of the phase error in the output signal. The PLL incrementally adjusts the frequency of the oscillator based on the determined phase error to control the frequency of the output signal.

While PLL synthesizers can efficiently operate at high frequencies, such as cellular communication frequencies, the analog control components of the PLL synthesizer are difficult to manufacture on silicon chips primarily designed for digital logic circuits. This manufacturing difficulty increases as the silicon chip size decreases. In addition, the loop bandwidth of a conventional PLL is typically too narrow to suppress oscillator phase noise at frequencies far from the desired frequency. Thus, conventional PLL synthesizers typically require additional resonant circuits designed to suppress the undesirable oscillator phase noise. These resonant circuits cause additional manufacturing difficulties because they require a large chip area. Further, these resonant circuits may couple, causing undesirable interference effects.

SUMMARY

The present invention addresses these problems by providing a digitally controlled analog frequency synthesizer. According to the present invention, the synthesizer includes an oscillator, digitizing circuit, reference signal generator, comparator, and control circuit. The digitizing circuit converts a feedback signal derived from the oscillator output signal to a digitized multi-phase feedback signal. In one embodiment, the feedback signal may comprise first and second phase components, such as In-phase and Quadrature components, and the digitizing circuit may directly sample and digitize the first and second phase components to generate the multi-phase feedback signal. In another embodiment, the digitizing circuit may sample the feedback signal at different times to generate the first and second phase components, and then digitize the generated first and second phase components to generate the multi-phase feedback signal.

The comparator compares the digitized multi-phase feedback signal to a reference signal generated by the reference signal generator. The output of the comparator comprises an error signal indicative of the phase error in the output signal. The control circuit generates a control signal based on the error signal to control the frequency of the oscillator output signal.

In some embodiments, the frequency synthesizer may further include a noise suppressor configured to suppress noise from the oscillator output signal based on the error signal. One exemplary noise suppressor includes a delay element, a digital-to-analog converter, and a modulator. The delay element delays the output signal by a predetermined delay and the digital-to-analog converter converts at least a portion of the error signal to an analog error signal. The modulator modulates the delayed version of the oscillator output signal based on the analog error signal to suppress noise from the oscillator output signal.

In another embodiment, the frequency synthesizer may include a temperature controller configured to compensate for errors in the oscillator output caused by temperature variations. One exemplary noise suppressor measures the temperature of the frequency synthesizer and generates an adjustment signal based on the measured temperature. The frequency synthesizer then uses the adjustment signal to compensate for temperature-based errors.

DETAILED DESCRIPTION

Figure 1:
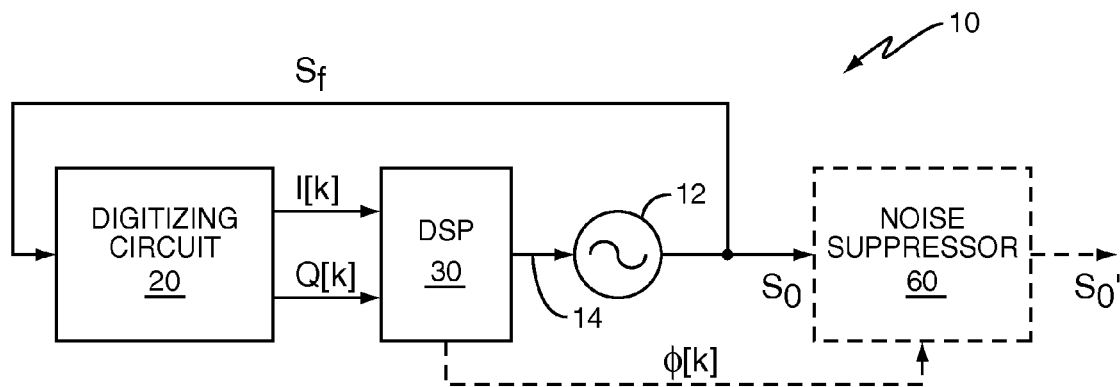
FIG. 1 shows a block diagram of a frequency synthesizer according to one embodiment of the present invention.

The present invention provides a frequency synthesizer that may be fabricated on small silicon chips without consuming large amounts of power. FIG. 1 shows one exemplary frequency synthesizer 10 according to the present invention. Frequency synthesizer 10 includes an oscillator 12, digitizing circuit 20, and digital signal processor (DSP) 30. In some embodiments, the frequency synthesizer 10 may also include a noise suppressor 60, as discussed further below. Oscillator 12 generates an analog output signal $S_o$ at a desired frequency. The oscillator 12 may be any type of oscillator of electronically controllable frequency, including but not limited to an inductor-capacitor resonant circuit oscillator, a Surface Acoustic Wave oscillator, or a multi-vibrator. The oscillator may also operate at a multiple of the desired output frequency, its output then being divided by digital dividers to produce the multi-phase feedback signal $S_f$. Digitizing circuit 20 and DSP 30 cooperate to generate a control signal 14 that controls the frequency of the output signal $S_o$. Generally, the digitizing circuit 20 generates a digitized multi-phase feedback signal, the components of which may be used to determine the instantaneous phase of the oscillator 12 at the sampling instant, for example, a pair of I, Q or Cartesian coordinates. The DSP 30 processes the multi-phase feedback signal to compute the phase error in the output signal $S_o$ and to generate the control signal to correct for the phase error. The following describes the present invention in terms of multi-phase signals having In-phase (I) and Quadrature (Q) phase components. However, it will be appreciated that other multi-phase signals having at least two phase-related components that are uniquely associated with a particular phase between 0 and $2\pi$ are applicable. For example, a multi-phase signal having two triangular components with a relative quarter cycle displacement are applicable. Alternatively, a multi-phase signal having square wave components that are low pass filtered to create sine waves, triangular waves, or sawtooth waves are also applicable.

Figure 2:
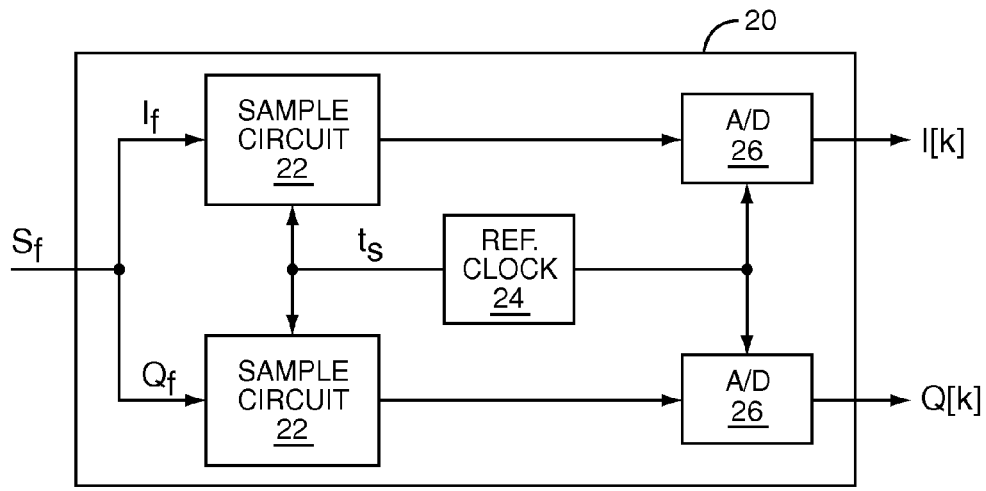
FIG. 2 shows a block diagram for a first exemplary digitizing circuit for the frequency synthesizer of FIG. 1.

FIG. 2 shows a block diagram of a digitizing circuit 20 according to one embodiment. For this embodiment, the feedback signal $S_f$ input to the digitizing circuit 20 comprises an analog multi-phase feedback signal $S_f(I_f, Q_f)$ having I and Q components. The analog multi-phase feedback signal $S_f(I_f, Q_f)$ may be derived from a multi-phase output signal $S_o(I_o, Q_o)$ produced when oscillator 12 comprises a Quadrature oscillator 12. Quadrature oscillators, which have two outputs relatively displaced in phase by one quarter cycle, may be constructed by running any type of oscillator at four times the desired frequency, and dividing by four using a 2-stage, feedback shift register to provide balanced I and Q components (I, Q, $\bar{I}$, and $\bar{Q}$). Quadrature oscillators may also be constructed by running an oscillator at twice the desired frequency, and using both edges to clock logic circuits that divide by two. Alternatively, the analog multi-phase feedback signal $S_f(I_f, Q_f)$ may be derived by coupling a portion of the output signal $S_o$ into a 90° phase-splitting circuit. It will be appreciated that other methods for deriving the multi-phase feedback signal $S_f(I_f, Q_f)$ may also be used.

The digitizing circuit 20 of FIG. 2 comprises sampling circuits 22, a reference clock 24, and analog-to-digital converters 26. Sampling circuits 22 sample the I or Q component at a sample time $t_S$ defined by the reference clock 24. The reference clock 24 may comprise a quartz crystal oscillator or SAW oscillator that outputs a pulse at the desired sample time $t_S$. The analog-to-digital converters 26 digitize the I and Q samples at the desired sample time to generate a digitized multi-phase feedback signal having a digital In-phase component I[k] and a digital Quadrature component Q[k]. The analog-to-digital converters 26 may comprise any known analog-to-digital converters. For example, for high speed operations the analog-to-digital converters 26 may comprise FLASH analog-to-digital converters.

Figure 3:
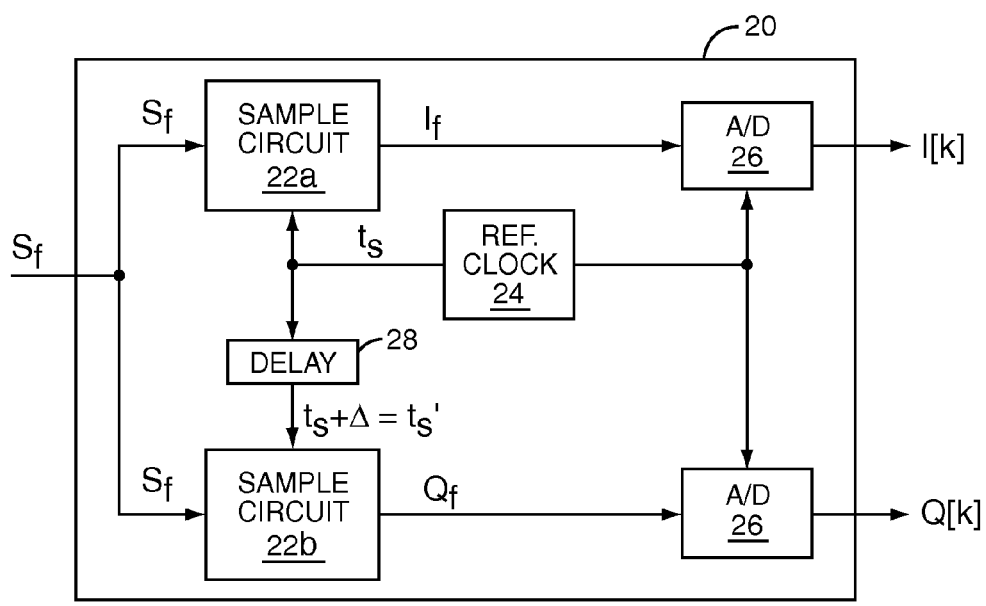
FIG. 3 shows a block diagram for a second exemplary digitizing circuit for the frequency synthesizer of FIG. 1.

FIG. 3 shows an alternate embodiment of the digitizing circuit 20 that generates the digitized multi-phase feedback signal from a single-phase feedback signal $S_f$. The digitizing circuit 20 according to this embodiment comprises sampling circuits 22a, 22b, a reference clock 24, analog-to-digital converters 26, and a delay element 28. Sample circuit 22a samples the feedback signal $S_f$ at the sample time $t_S$ provided by the reference clock 24, as discussed above, to generate samples of an In-phase component of the feedback signal. Delay element 28 delays the sample time a predetermined amount ($\Delta$), and sample circuit 22b samples the feedback signal $S_f$ at the delayed sample time ($t_S+\Delta$) to generate samples of a Quadrature component of the feedback signal. For example, delay element 28 may delay the sample time by ¼ of a cycle relative to the desired frequency. In some embodiments, delay element 28 may delay the sample time by an odd multiple of ¼ of the cycle relative to the desired frequency. The analog-to-digital converters 26 digitize the I and Q samples to generate the digitized multi-phase feedback signal having a digital In-phase component I[k] and a digital Quadrature component Q[k].

The digitized multi-phase feedback signal comprises constant values when the oscillator frequency is an integer multiple of the reference clock frequency. If the oscillator frequency is not an integer multiple of the reference clock frequency, the multi-phase feedback signal rotates in the complex plane at a rate given by the difference between the oscillator frequency and the nearest multiple of the reference clock frequency, referred to herein as the difference frequency dW. This rotational progression is known for each output signal frequency, and therefore, can be removed by de-rotating the multi-phase feedback signal. After de-rotation based on the known difference frequency dW, any remaining phase differences are indicative of a frequency error equal to the difference between the desired oscillator output signal frequency and the actual oscillator output signal frequency.

Figure 4:
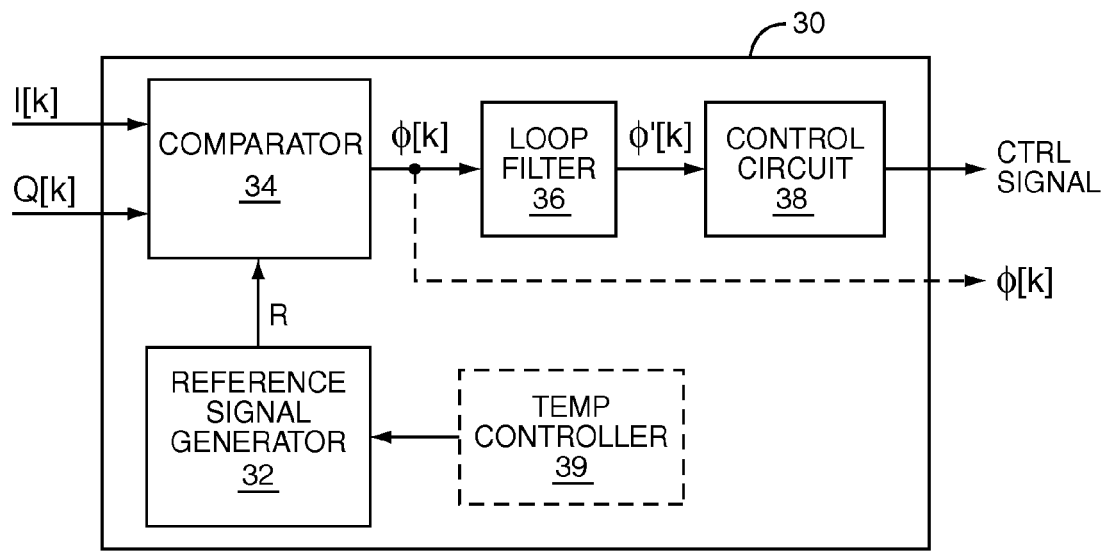
FIG. 4 shows a block diagram for an exemplary DSP for the frequency synthesizer of FIG. 1.

DSP 30 processes the digitized multi-phase feedback signal to determine this error and to generate the corresponding control signal for the oscillator 12 to correct the error. FIG. 4 (change spelling of ckt) shows one exemplary DSP 30 according to the present invention. DSP 30 comprises a reference signal generator 32, comparator 34, loop filter 36, and control circuit 38. Reference signal generator 32 generates a reference signal R corresponding to the desired frequency. Comparator 34 compares the multi-phase feedback signal to the reference signal to de-rotate the multi-phase feedback signal and to generate an error signal $\phi[k]$ indicative of the phase error present in the output signal $S_o$. Loop filter 36 filters the error signal $\phi[k]$ to generate a filtered error signal $\phi'[k]$, and control circuit 38 generates the oscillator control signal based on the filtered error signal $\phi'[k]$. It will be appreciated that the reference signal generator 32, comparator 34, loop filter 36, and control circuit 38 may be implemented in software, hardware, or any combination thereof.

The reference signal generated by the reference signal generator 32 corresponds to the desired frequency. Specifically, the reference signal is a succession of digital values at a sample rate derived from reference oscillator 24 that mimic the expected variations of the digitized multi-phase feedback signal when oscillator 12 is operating at the desired instantaneous frequency and phase. The desired frequency and phase may correspond to oscillator 12 running at a fixed frequency, or may correspond to a frequency that is varied or modulated in a desired manner. For example, the varying frequency may correspond to the frequency and phase modulation desired to generate an arbitrarily modulated signal using a polar modulation transmitter. It will be appreciated that this feature may be used in a polar loop transmitter, as described in V. Petrovic et al.: "Polar-Loop Transmitter", Bath School of Electrical Engineering, March 1979, by extending the current invention to control both the phase and amplitude of the output signals used by the transmitter to produce an output signal having a desired frequency and a desired modulation.

The comparator 34 compares the digitized reference signal to the digitized multi-phase feedback signal to generate the error signal $\phi[k]$. As described in more detail below, the comparator 34 may perform the comparison using multi-phase feedback and reference signals having I and Q components. Alternatively, the comparator 34 may convert the multi-phase feedback signal to a single phase feedback signal, and perform the comparison using the single phase feedback signal and a single phase reference signal. The error signal is constant when the oscillator frequency equals the desired frequency. When this constant is arbitrarily set to zero, a non-zero error signal φ[k] indicates the presence and magnitude of the phase error present in the output signal $S_o$.

Loop filter 36 filters the error signal φ[k] to generate a filtered error signal φ'[k] according to any known method. Generally, the loop filter 36 computes an integral of the error signal φ[k] using an accumulator. The loop filter 36 then combines a portion of the integrated error signal with a portion of the non-integrated error signal to form a proportional-integral (PI) control system. The integrated and non-integrated portions determine a loop bandwidth and a damping factor. When the loop is critically damped, i.e., when the damping factor is unity, the loop filter 36 provides optimum transient settling during frequency adjustment periods.

The control circuit 38 converts the filtered error signal φ'[k] to any form required to control the oscillator 12. For example, the control circuit 38 may convert the filtered error signal φ'[k] to an analog current control signal when the oscillator 12 comprises an emitter-coupled multi-vibrator. Alternatively, the control circuit 38 may convert the filtered error signal φ'[k] to an analog voltage control signal when the oscillator 12 comprises a voltage-controlled oscillator (VCO). The control circuit 38 may also use binary-switched elements, such as inductors capacitors, or resistors to directly convert the filtered error signal φ'[k] to a digital voltage or current control signal for a digitally-tuned oscillator, as discussed further below.

Figure 5:
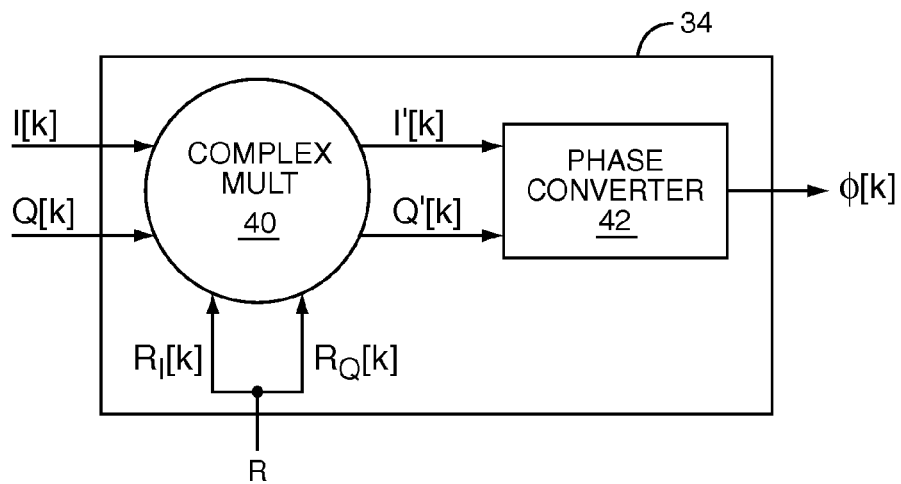
FIG. 5 shows a block diagram of a first exemplary comparator for the DSP of FIG. 4.

FIG. 5 shows one exemplary comparator 34 comprising a complex multiplier 40 and a phase converter 42. For this embodiment, the reference signal R comprises a digitized multi-phase reference signal R[k] represented in Cartesian coordinates. For example, the multi-phase reference signal R may comprise an In-phase component ($R_I[k]=\cos(dW \cdot t[k])$) and a Quadrature component ($R_Q[k]=\sin(dW \cdot t[k])$), where $R[k]=R_I[k]+jR_Q[k]$ and t[k] is the time of the $k^{th}$ sampling instant. When complex multiplier 40 comprises a full complex multiplier, it de-rotates the multi-phase feedback signal by respectively combining the I and Q components of the multi-phase reference signal with the I and Q components of the multi-phase feedback signal. The resulting multi-phase error signal (I'[k], Q'[k]) represents the In-phase and Quadrature errors present in the output signal $S_o$.

Phase converter 42 generates the error signal 0[k] by converting the multi-phase error signal to a single-phase error signal. In general, phase converter 42 performs this conversion by converting the I[k] and Q[k] Cartesian coordinates of the multi-phase error signal to polar coordinates to generate the error signal φ[k]. The phase converter 42 may perform this conversion using any known means. For example, when I and Q are sine and cosine components, the phase converter 42 may compute the arctangent of the I and Q components of the multi-phase error signal to convert the error signal from Cartesian coordinates to polar coordinates. In one embodiment, the phase converter 42 uses the Cordic algorithm to perform the arctangent computation. Alternatively, when I and Q are symmetric waveforms, i.e., symmetric triangular waveforms, symmetric sine/cosine waveforms etc., the error signal φ[k] relates to the amplitude independent ratio of the smaller of I and Q to the larger of I and Q. The ratio may be used to index a look-up table to determine the error signal φ[k]. In another example, DSP 30 may remember the peak value of the observed I or Q component and may normalize the I and Q values to the peak value. In still another example, DSP 30 may control the amplitude of the oscillator output signals such that the peak values of I[k] and Q[k] equal the maximum digital value. This option avoids the need to compute a ratio, and in the case where triangular waveforms are used, results in the error signal being equal to I[k] or Q[k] without any look-up table conversion.

When the Quadrature component of the multi-phase feedback signal is small, the full complex multiplier 40 discussed above may be replaced by a half-complex multiplier 40 that uses the Quadrature portion $R_Q[k]$ of the multi-phase reference signal to de-rotate the Quadrature portion Q[k] of the multi-phase feedback signal. The error signal φ[k] may be derived from the resulting Quadrature error signal Q[k]. In some cases, φ[k]≅Q'[k].

Figure 6:
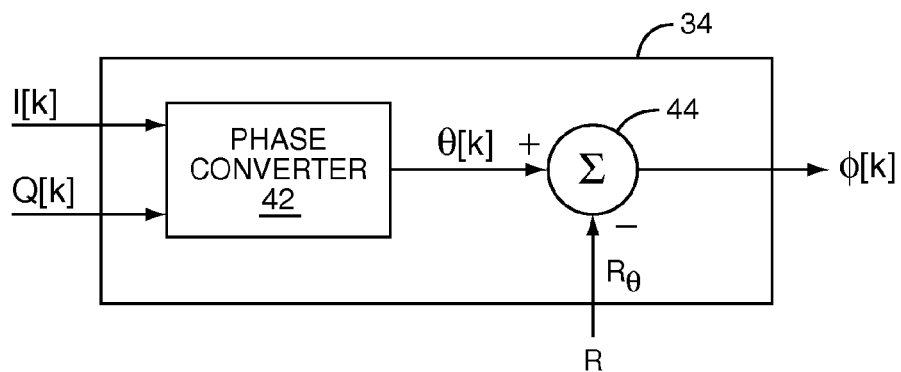
FIG. 6 shows a block diagram of a second exemplary comparator for the DSP of FIG. 4.

FIG. 6 shows another exemplary comparator 34 comprising a phase converter 42 and a combiner 44. For this embodiment, the reference signal R comprises a digitized phase signal $R_\theta$ represented in polar coordinates. Phase converter 42 converts the multi-phase feedback signal to a single-phase feedback signal θ[k] according to any known method. For example, when the multi-phase signal comprises I and Q phase components, the phase converter 42 may use any known arctangent algorithm to perform the conversion, such as the Cordic algorithm, as discussed above. Combiner 44 de-rotates the single-phase feedback signal θ[k] by subtracting the reference phase signal $R_\theta$ from the single-phase feedback signal θ[k] to generate the error signal φ[k].

After loop filter 36 filters the error signal, the control circuit 38 generates a control signal to control the oscillator 12 based on the filtered error signal φ'[k]. For analog oscillators, control circuit 38 first converts the filtered error signal to an analog control signal. The required accuracy associated with controlling oscillator 12 is likely to be greater than the accuracy of a conventional digital-to-analog converter. For example, controlling oscillator 12 to an accuracy of 20 Hz (20 Hz jitter measured in some specified jitter bandwidth), where the oscillator frequency is 2 GHz, requires an accuracy of $10^8$. This level of accuracy requires a monotonic digital-to-analog converter having at least 27 bits of resolution.

Figure 7:
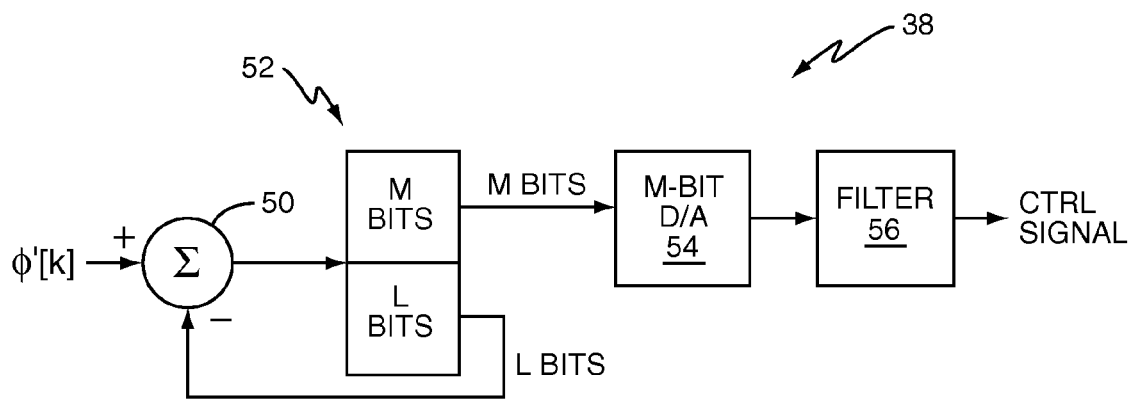
FIG. 7 shows a block diagram of a first exemplary control circuit for the DSP of FIG. 4.

In one embodiment, two 14-bit digital-to-analog converters may be used to develop a coarse and a fine control signal, with the range of the fine control signal being about twice the value of one least significant bit (LSB) of the coarse signal. In this case, control circuit 38 sets the coarse digital-to-analog converter such that the fine digital-to-analog converter operates in the middle of its range In an alternate embodiment, the control circuit 38 may use a digital-to-analog converter having a limited word length, as shown in FIG. 7. The control circuit 38 in FIG. 7 comprises an accumulator 50, a register 52, an M-bit digital-to-analog converter 54, and a filter 56. For this example, assume that the filtered error signal φ'[k] comprises a digital word having M most significant bits and L least significant bits. At each clock pulse, accumulator 50 combines the current filtered error signal φ'[k] with the L bits stored in register 52 from the previous iteration, and stores the new value in register 52. The accumulator 50 may employ saturation arithmetic, where the sum is limited to the largest bit value when overflow occurs. The rate at which the clock pulses are applied to the register 52 may be any multiple of the rate at which new error signals are applied to the accumulator 50. Higher multiples result in a reduced spectral density of the quantization noise, which result in lower oscillator phase noise spectral density.

Digital-to-analog converter 54 extracts the M most significant bits from the register 52, and converts them to an analog signal. Filter 56 low-pass filters the analog signal according to any known means to generate the control signal. The register 52 then sets the M most significant bits to zero, which leaves the unused L least significant bits intact for the next iteration. Thus, while the effect of the least significant bits is delayed, it is not lost. In this way, the mean value of the control signal is equal to the filtered error signal $\phi'[k]$ to the full desired accuracy.

The control circuit 38 in the embodiment of FIG. 7 jitters the output of the digital-to-analog converter 54 between two or more adjacent values to provide a desired mean value. The resulting noise spectrum is thinly spread over a wide frequency range such that the noise spectral density is sufficiently low to meet the desired frequency jitter in the specified jitter bandwidth. U.S. Pat. No. 6,278,867 to Northcutt et al., which is incorporated herein by reference, further describes an example of this control circuit.

Figure 8:
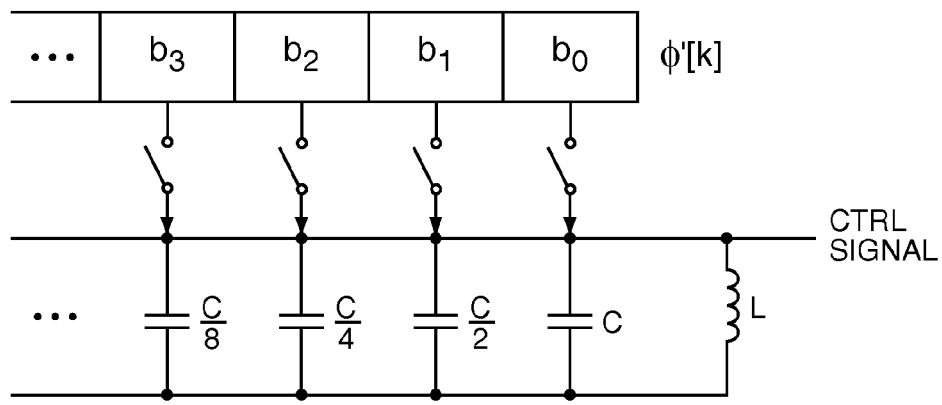
FIG. 8 shows a block diagram of a second exemplary control circuit for the DSP of FIG. 4.

In another alternative embodiment, the control circuit 38 may avoid direct digital-to-analog conversion all together. For example, the filtered error signal $\phi'[k]$ may control a binary-switched capacitor that varies the tuning of an inductor-capacitor resonant circuit, as shown in FIG. 8. The control circuit 38 in FIG. 8 comprises a set of capacitors in a binary sequence of capacitance values, such as C, C/2, C/4, C/8, etc., in parallel with an inductor L. The set of capacitors are switched in or out under the control of the bits from the filtered error signal. In practice, when a capacitor is switched out, its contribution does not go to zero, but rather the total capacitance changes, for example, from an initial capacitance to the sum of an initial capacitance and C, the sum of an initial capacitance and C/2, etc. Each switched capacitor has only two possible values that may thus be selected using the appropriate bit of the control signal. These capacitors may also be more or less continuously variable between their two values, allowing the one-bit control signal transition to be smoothed in order to reduce the oscillator noise spectral sidebands. The inductor-capacitor resonant circuit may be part of the sustaining loop of oscillator 12 such that it oscillates at the desired frequency to produce the analog multi-phase feedback signal. It will be appreciated that this embodiment requires a monotonic control circuit. These issues may be addressed in similar manners.

For digitally controlled oscillators 12, control circuit 38 may output the M+L bits of the filtered error signal $\phi'[k]$ directly to the oscillator 12. Alternatively, control circuit 38 may output the M bits of the filtered error signal $\phi'[k]$ from the register 52 shown in FIG. 7.

The present invention may include noise suppression circuitry 60 to reduce phase noise present in the oscillator output signal $S_o$. Phase noise may comprise in-loop phase noise that originates from components within the feedback loop, such as from the oscillator 12 and/or from thermal noise in various passive components in the loop filter 36 and/or control circuit 38. Phase noise may also comprise out-of-loop phase noise that originates from components outside the feedback loop, such as from the reference signal generator 32. Due to the finite word length associated with the digital-to-analog converter, the phase noise may also result when the filtered error signal $\phi'[k]$ oscillates between two quantizing steps. Computing the error signal $\phi[k]$ and processing it as discussed above may address this last type of phase noise.

Once the frequency synthesizer 10 is locked on the desired frequency, the multi-phase error signals (I'[k], Q'[k]) and the filtered error signal $\phi'[k]$ generally exhibits only small fluctuations due to the in-loop and out-of-loop phase noise. In-loop phase noise may be suppressed by the feedback loop response, which has a high-pass frequency response characteristic that suppresses noise close to the desired frequency.

Such noise is referred to herein as close-to-carrier phase noise. Out-of-loop phase noise may be suppressed by the frequency response of the loop filter 36, which has a low-pass frequency response characteristic that suppresses phase noise outside the bandwidth of the feedback loop. Thus, to minimize the total phase noise, the bandwidth of the feedback loop is chosen to compromise between the in-loop and out-of-loop noise contributions.

Figure 9:
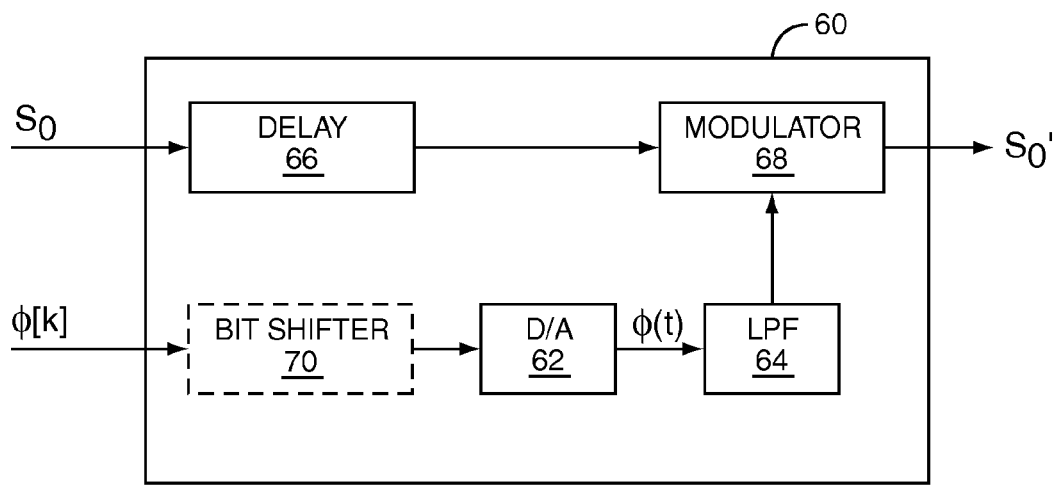
FIG. 9 shows a block diagram for an optional noise suppressor for the frequency synthesizer of FIG. 1.

To further suppress phase noise the frequency synthesizer 10 may include a noise suppressor 60, as shown in FIG. 9. Noise suppressor 60 processes the error signal $\phi[k]$, which is fed forward from the DSP 30, to suppress phase noise from the oscillator output signal $S_o$. As a result, the noise suppressor 60 may suppress phase noise up to half the phase sampling frequency.

The noise suppressor 60 delays and modulates the oscillator output signal $S_o$ based on the error signal $\phi[k]$ to suppress noise from the oscillator output signal $S_o$. More particularly, noise suppressor 60 comprises a digital-to-analog converter 62, a low pass filter 64, a delay element 66, and a modulator 68. Digital-to-analog converter 62 converts the error signal $\phi[k]$ to an analog error signal $\phi(t)$, and filters the analog error signal $\phi(t)$ to band-limit it to the Nyquist frequency of half of the sampling rate of the digital-to-analog converter 64. Delay element 66 delays the oscillator output signal $S_o$ to match the delay present in the analog error signal $\phi(t)$ at the input to the modulator 68 relative to the input of digitizing circuit 20. The delay element 66 may comprise a transmission line, a SAW or glass delay line, an all-pass network, or any other delay element known in the art. Modulator 68 modulates the delayed oscillator output signal by the filtered analog error signal to demodulate the phase noise from the output signal. The resulting modified output signal $S_o'$ has reduced phase noise relative to the oscillator output signal $S_o$. When the delay introduced by delay element 66 accurately matches the delay of the filtered analog error signal, a wide range of phase noise from the desired frequency will be suppressed. However, if the delay element 66 does not accurately match the error signal delay, only low frequency phase noise is suppressed.

It will be appreciated that the phase noise of a locked frequency synthesizer may have an RMS value much less than the full scale of phase values, i.e., $\pm\pi$. For example, if the error signal $\phi[k]$ is a 24-digit word, then the RMS phase noise of a locked frequency synthesizer 10 may be −60 dB relative to $\pi$. In this example, the M most significant bits of the error signal $\phi[k]$ do not change much, if at all. Thus, it should be sufficient for noise suppression to convert only L least significant bits, i.e., 16 least significant bits, of the digital error signal $\phi[k]$ to the analog error signal $\phi(t)$. In this case, noise suppressor 60 may further include a bit shifter 70 that outputs only the L least significant bits of the digital error signal $\phi[k]$ to the digital-to-analog converter 62, as shown in FIG. 9. Alternatively, the bit shifter 70 may comprise a scalar multiplier 70 that effectively amplifies the RMS phase noise to a value that substantially fills the dynamic range of the digital-to-analog converter 62. This allows digital-to-analog converter 62 to operate more efficiently. It will be appreciated that the number of bits to be converted by the digital-to-analog converter 62 directly impacts the error signal delay, and therefore, impacts the delay applied to the oscillator output signal by delay element 66. Thus, the number of bits output by the bit shifter 70 and the delay of the delay element 66 may be selected to best suppress the phase/frequency noise of the output signal over a critical frequency range.

The frequency synthesizer 10 according to the present invention has a wide loop bandwidth. As a result, the phase noise within the loop bandwidth tends to equal the phase noise of the reference oscillator 24 multiplied by the ratio of the output signal frequency to the reference signal frequency. The phase noise suppression techniques discussed above extend the fraction of the loop bandwidth where this phase noise property holds. Regardless, because the in-loop phase noise is directly proportional to the phase noise of the reference oscillator 24, and because the phase noise of the reference oscillator 24 is largely due to the Q-factor of the resonator, resonator selection is an important reference oscillator design parameter. Quartz crystal reference oscillators tend to have better phase noise characteristics close to the desired frequency than other oscillators, but worse phase noise characteristics far from the desired frequency. Fundamental mode quartz crystals are also difficult to manufacture at frequencies above a few tens of MHz. In the hundreds of MHz range, reference oscillators may be constructed using SAW resonators, which have superior phase noise characteristics.

The present invention may also include temperature compensation. While quartz crystal oscillators have very good temperature stability at some operating frequencies, they do not have the accuracy or temperature stability required for mobile communication devices operating at cellular frequencies. Further, while SAW resonators have good accuracy and phase noise characteristics, the temperature stability of the SAW resonator is worse than that of the crystal oscillator. The present invention includes digital temperature compensation to address the temperature stability issues associated with conventional resonators.

One temperature compensation technique comprises detecting frequency errors in signals received from an accurate transmitter, such as a cellular base station. Based on the detected frequency errors, the reference signal generator 32 is controlled to produce a digital reference signal sequence that will result in oscillator 12 being adjusted to a frequency compensated for the error. In the prior art, a tuning component such as a variable capacitance diode applied a correction to the reference oscillator based on the received signal. One example of this technique is disclosed in U.S. Pat. No. 6,768,389 to Dent et al., which is herein incorporated by reference. It will be appreciated that the frequency synthesizer 10 of the present invention may use this technique to correct for temperature variations in oscillator 12.

It is desirable that, on first power up, the frequency synthesizer 10 will produce an almost accurate output frequency without waiting to receive an accurate signal. Thus, a technique to compensate for temperature variations without waiting for an accurate signal to be received is required. This can comprise a temperature measurement circuit to measure the temperature, and a look-up table to store compensating values previously associated with different temperatures. One example of this technique is disclosed in U.S. Pat. No. 6,278,867 to Northcutt et al., which is incorporated herein by reference. The '867 patent describes, among other things, methods for applying pre-stored temperature compensation correction values according to a temperature measurement from a temperature sensor, and methods for automatically refining the pre-stored temperature correction values whenever the apparatus is receiving a signal of known, accurate frequency. It will be appreciated that the frequency synthesizer 10 of the present invention may use this technique to correct for temperature variations in oscillator 12.

Instead of adjusting the oscillator output, temperature compensation may be applied by altering the phase rotation rate generated by the reference signal generator 32. Consider the following example. If the desired frequency of the output signal $S_o$ output by oscillator 12 is $F_o$, and the estimated reference frequency of the reference signal output by the reference signal generator 32 is $F_{ref}$, then the ratio $F_o/F_{ref}$ will have an integer part N and a fractional part dN such that $F_o=F_{ref}(N+dN)$ or $N+dN=F_o/F_{ref}$. Thus, if the reference frequency $F_{ref}$ is chosen to be the center frequency value in a range of desired frequency values, and if $F_{ref}$ is divided by some predetermined fixed integer N, then the desired frequency $F_o$ can be varied plus or minus about that center frequency by allowing dN to range approximately from −0.5 to +0.5, giving a total tuning range of $1 \times F_{ref}$.

Reference signal generator 32 utilizes the value of dN to generate clockwise or anticlockwise rotation of the feedback signal by generating the appropriate sequence of values of cos[dWk] and sin[dWk], where dWk=2πk(dN)($F_{ref}$). If k=K/$F_{ref}$ then dWk=|2πKdN| modulo 2π, for computation of which it suffices to compute |KdN| modulo 1. Thus, dN may be added to an accumulator upon each reference clock cycle, where the accumulator is allowed to overflow (wrap around) when dN becomes greater than 0.5 or less than −0.5. A frequency modulation may also be applied to the output frequency by varying the value of dN from one sample period to the next. This may be used as part of a polar modulation system for generating arbitrary modulations.

An estimate of the temperature adjusted reference frequency $F_{ref}$ may initially be obtained by reading a temperature sensor to determine a temperature of the reference signal generator 32, and looking up the value of the reference frequency $F_{ref}$ in a pre-defined look-up table that associates a plurality of reference frequencies with different temperatures. When the desired frequency is used as a local oscillator frequency in a receiver to receive a signal of known accurate frequency, the receiver can further determine its own frequency error relative to the known signal frequency and thereby determine a more accurate value for the reference frequency $F_{ref}$. The more accurate value is then used to update the stored table of temperature calibration values.

If the initial accuracy of the reference frequency $F_{ref}$ obtained from the temperature correction table is inadequate to properly decode a signal, or is in error by more than half a communications channel spacing such that the receiver locks on to the wrong channel, the methods described in U.S. Pat. No. 5,774,799 to Croft et al. may be used to acquire the signal and correct the stored estimate of the reference frequency $F_{ref}$ in the temperature calibration table. The '799 patent is also herein incorporated by reference.

When a high-frequency SAW oscillator is used in the reference signal generator 32 to generate the reference frequency for the frequency synthesizer part of a digital radio apparatus, it may also be desirable that the same SAW oscillator be used to derive other required frequencies, such as communication bit rates of CDMA chip rates. This may be done for example using Direct Digital Frequency synthesis (DDS or DDFS), which is a know technique based on incrementing an accumulator to form a value Wt, and then using a sine or cosine look-up table or both to generate a sine wave. The generated sine wave may be low pass filtered to remove substantially all vestiges of the original digital quantization to provide a time-continuous clock signal. A slicer circuit may be used to square up the clock signal to provide a low-jitter clock signal suitable for driving digital logic circuits.

Because the phase noise suppression is better due to the wider loop bandwidth when using the invention, it may be possible in some cases for the oscillator 12 to be built with smaller and lower-Q resonators or no resonators at all, e.g. by using a multi-vibrator technique such as emitter-coupled multi-vibrators or the four-layer diode equivalent circuit disclosed in U.S. Pat. No. 5,654,677 to Dent.

The above-described frequency synthesizer uses digital signal processing techniques to control an oscillator and reference signal generator. Thus, the frequency synthesizer 10 may be constructed using fewer analog and discrete components external to an integrated circuit. Further, the frequency synthesizer 10 is easier to integrate onto a silicon chip. This enables the chip designers to reduce size, chip area, and power consumption with each generation of improved digital chip technology. Thus, the frequency synthesizer 10 of the present invention may be fabricated on silicon chips having sub-micron geometry requirements.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A frequency synthesizer for generating output signals at a desired frequency, the frequency synthesizer comprising:
    an oscillator to generate an analog output signal;
    a digitizing circuit to convert a feedback signal derived from the output signal to a digitized multi-phase feedback signal;
    a reference signal generator to generate a digitized reference signal;
    a comparator to compare said multi-phase feedback signal to said reference signal to generate a multi-bit digitized error signal indicative of a phase error in said output signal; and
    a control circuit to generate a control signal based on the multi-bit error signal to control the frequency of the output signal, said control circuit comprising:
        a combiner to generate a revised error signal based on a current error signal and the L least significant bits from a previous error signal; and
        a digital-to-analog converter to generate the control signal based on the M most significant bits of the revised error signal.

2. The frequency synthesizer of claim 1 wherein said feedback signal comprises first and second phase components, and wherein the digitizing circuit separately samples and digitizes the first and second phase components of the feedback signal.

3. The frequency synthesizer of claim 2 wherein said first and second phase components comprise an In-phase component and a Quadrature phase component.

4. The frequency synthesizer of claim 1 wherein said digitizing circuit samples the feedback signal at different sampling times to generate first and second phase components.

5. The frequency synthesizer of claim 1 wherein said reference signal comprises a single-phase reference signal.

6. The frequency synthesizer of claim 5 wherein said comparator comprises:
    a phase converter to determine a single-phase feedback signal from the multi-phase feedback signal; and
    a combiner following the phase converter to subtract said single-phase reference signal from said single phase feedback signal to generate the error signal.

7. The frequency synthesizer of claim 1 wherein said reference signal comprises a multi-phase reference signal.

8. The frequency synthesizer of claim 7 wherein said comparator comprises:
    a full complex multiplier to determine a multi-phase error signal based on the multi-phase feedback signal and the multi-phase reference signal; and
    a phase converter following the full complex multiplier to determine the error signal by converting the multi-phase error signal to a single-phase error signal.

9. The frequency synthesizer of claim 7 wherein said comparator comprises a half complex multiplier to determine a Quadrature phase component of a multi-phase error signal based on a Quadrature phase component of the multi-phase feedback signal and a Quadrature phase component of the multi-phase reference signal.

10. The frequency synthesizer of claim 9 wherein said comparator further comprises a phase converter following the half complex multiplier to convert the Quadrature phase component of the multi-phase error signal to the error signal.

11. The frequency synthesizer of claim 1 wherein the reference signal generator generates the reference signal based on a known frequency error associated with the oscillator.

12. The frequency synthesizer of claim 1 further comprising a temperature controller configured to:
    measure a temperature of the frequency synthesizer; and
    generate an adjustment signal based on the measured temperature to compensate for frequency errors caused by variations in temperature.

13. The frequency synthesizer of claim 1 further comprising a noise suppressor configured to suppress phase noise from the output signal based on the error signal.

14. The frequency synthesizer of claim 13 wherein the noise suppressor comprises:
    a delay element to delay the output signal by a predetermined delay;
    a digital-to-analog converter to convert at least a portion of the error signal to an analog error signal; and
    a modulator to modulate the delayed version of the output signal based on the analog error signal to suppress the phase noise from the output signal.

15. The frequency synthesizer of claim 14 wherein the predetermined delay matches the delay associated with the analog error signal at the input to the modulator.

16. The frequency synthesizer of claim 14 wherein the digital-to-analog converter converts the L least significant bits to the analog error signal.

17. The frequency synthesizer of claim 14 wherein the oscillator comprises a low-Q resonator.

18. The frequency synthesizer of claim 1 wherein the output signal comprises first and second phase components.

19. The frequency synthesizer of claim 18 wherein the first component is an In-phase component, and wherein the second component is a Quadrature phase component.

20. The frequency synthesizer of claim 18 wherein said output signal comprises balanced In-phase and Quadrature phase components.

21. The frequency synthesizer of claim 1 further comprising a frequency divider configured to divide the frequency of the output signal by a predetermined factor to generate the feedback signal.

22. The frequency synthesizer of claim 1 wherein the control signal comprises one of an analog voltage control signal, an analog current control signal, a digital voltage control signal, and a digital current control signal.

23. The frequency synthesizer of claim 1 further comprising a loop filter to filter the error signal, wherein the control circuit generates the control signal based on the filtered error signal to control the frequency of the output signal.

24. A method for generating output signals at a desired frequency from a frequency synthesizer having an oscillator, the method comprising:

generating an analog oscillator output signal;
converting a feedback signal derived from the output signal to a digitized multi-phase feedback signal;
generating a digitized reference signal;
comparing said multi-phase feedback signal to said reference signal to generate a multi-bit digitized error signal indicative of a phase error in said output signal;
generating a control signal based on the multi-bit error signal; and
controlling a frequency of the oscillator with the control signal to control the frequency of the output signal, wherein controlling said frequency comprises:
combining a current error signal with the L least significant bits from a previous error signal to generate a revised error signal; and
converting the M most significant bits of the revised error signal to generate the control signal.

25. The method of claim 24 wherein said feedback signal comprises first and second phase components, and wherein converting the feedback signal comprises separately sampling and digitizing the first and second phase components of the feedback signal.

26. The method of claim 25 wherein said first and second phase components comprise an In-phase component and a Quadrature phase component.

27. The method of claim 24 wherein converting the feedback signal comprises:
sampling the feedback signal at different sampling times to generate first and second phase components; and
digitizing the first and second phase components.

28. The method of claim 24 wherein generating said reference signal comprises generating a single-phase reference signal.

29. The method of claim 28 wherein said comparing step comprises:
converting the multi-phase feedback signal to a single-phase feedback signal; and
subtracting the single-phase reference signal from the single phase feedback signal to generate the error signal.

30. The method of claim 24 wherein generating said reference signal comprises generating a multi-phase reference signal.

31. The method of claim 30 wherein said comparing step comprises:
multiplying the multi-phase feedback signal by the multi-phase reference signal in the complex domain to determine a multi-phase error signal; and
converting the multi-phase error signal a single-phase error signal.

32. The method of claim 30 wherein said comparing step comprises:
multiplying a Quadrature phase component of the multi-phase feedback signal by a Quadrature phase component of the multi-phase reference signal to determine a Quadrature phase component of a multi-phase error signal; and
converting the Quadrature phase component of the multi-phase error signal to a single-phase error signal.

33. The method of claim 24 wherein generating the reference signal comprises generating the reference signal based on a known frequency error associated with the oscillator.

34. The method of claim 24 further comprising:
measuring a temperature of the frequency synthesizer;
generating an adjustment signal based on the measured temperature; and
compensating for frequency errors caused by temperature variations.

35. The method of claim 24 further comprising suppressing phase noise from the output signal based on the error signal.

36. The method of claim 35 wherein suppressing the phase noise comprises:
delaying the output signal by a predetermined delay;
converting at least a portion of the error signal to an analog error signal; and
modulating the delayed version of the output signal with the analog error signal to suppress the phase noise from the output signal.

37. The method of claim 36 wherein the predetermined delay matches the delay associated with the analog error signal.

38. The method of claim 36 wherein converting at least a portion of the error signal comprises converting the L least significant bits of the error signal to the analog error signal.

39. The method of claim 24 wherein the output signal comprises first and second phase components.

40. The method of claim 39 wherein the first component is an In-phase component, and wherein the second component is a Quadrature phase component.

41. The method of claim 39 wherein said output signal comprises balanced In-phase and Quadrature phase components.

42. The method of claim 24 further comprising dividing the frequency of the output signal by a predetermined factor to generate the feedback signal.

43. The method of claim 24 wherein the control signal comprises one of an analog voltage control signal, an analog current control signal, a digital voltage control signal, and a digital current control signal.

44. The method of claim 24 further comprising filtering the error signal, wherein generating the control signal comprises generating the control signal based on the filtered error signal.

* * * * *

UNITED STATES PATENT AND TRADEMARK OFFICE
CERTIFICATE OF CORRECTION

PATENT NO. : 7,570,123 B2
APPLICATION NO. : 11/616598
DATED : August 4, 2009
INVENTOR(S) : Dent et al.

It is certified that error appears in the above-identified patent and that said Letters Patent is hereby corrected as shown below:

In Column 6, Line 14, delete "Q[k]." and insert -- Q'[k]. --, therefor.

Signed and Sealed this

Twenty-fourth Day of November, 2009

David J. Kappos
*Director of the United States Patent and Trademark Office*